United States Patent [19]

Flores

[11] Patent Number: 5,545,845

[45] Date of Patent: Aug. 13, 1996

[54] TRANSPORTABLE WEATHERTIGHT EMI SHIELDED CABINET STRUCTURE

[75] Inventor: Michael A. Flores, Plano, Tex.

[73] Assignee: DSC Communications Corporation, Plano, Tex.

[21] Appl. No.: 342,753

[22] Filed: Nov. 21, 1994

[51] Int. Cl.⁶ .................................................. H05K 9/00
[52] U.S. Cl. .................. 174/35 R; 174/65 R; 361/818; 277/901
[58] Field of Search .............................. 174/35 R, 356 C, 174/50, 52.1, 65 R; 361/816, 818; 277/901

[56] References Cited

U.S. PATENT DOCUMENTS

| | | | |
|---|---|---|---|
| 4,045,104 | 8/1977 | Peterson | 312/257 R |
| 4,399,317 | 8/1983 | Van Dyk, Jr. | 174/35 GC |
| 4,652,695 | 3/1987 | Busby | 174/35 GC |
| 4,659,869 | 4/1987 | Busby | 174/35 GC |
| 4,710,590 | 12/1987 | Ekdahl | 174/35 GC |
| 4,760,496 | 7/1988 | Koch | 361/424 |
| 4,768,845 | 9/1988 | Yeh | 312/257 SK |
| 4,818,054 | 4/1989 | George et al. | 350/96.20 |
| 5,039,826 | 8/1991 | Newland | 174/35 R |
| 5,045,635 | 9/1991 | Kaplo et al. | 174/35 GC |
| 5,164,543 | 11/1992 | Benson et al. | 174/35 R |
| 5,194,691 | 3/1993 | McIlwraith | 174/35 GC |
| 5,223,670 | 6/1993 | Hogan et al. | 174/35 MS |
| 5,239,128 | 8/1993 | Golden et al. | 174/50 |
| 5,250,752 | 10/1993 | Cutright | 174/35 R |

OTHER PUBLICATIONS

Author Unknown, "Generic Requirements for Electronic Equipment Cabinets", *Bellcore Technical Advisory* TA–NWT–000487, Issue 2, Jun. 1993, pp. i–viii and 1–37.

Author Unknown, "Electronic Equipment Cabinets (Subscriber Carrier/Fiber in the Loop)", *BellSouth Telecommunications Specification* BS–631–0032, Issue 1, Nov. 1992, pp. 1–28.

*Primary Examiner*—Kristine L. Kincaid
*Assistant Examiner*—Robert J. Decker
*Attorney, Agent, or Firm*—Baker & Botts, L.L.P.

[57] ABSTRACT

A weathertight and EMI shielded cabinet (10) for housing electronic equipment is disclosed. The cabinet (10) is structurally supported and framed by a tubular frame (30) which defines a generally rectangular structure having upper horizontal frame members (34, 36), lower horizontal frame members (38, 40), and vertical corner posts (42). The tubular frame (30) may include internal cross members (60, 62) to further reinforce the structure. Door openings are further defined by vertical door frame members (56). A plurality of outer skins (80, 84, 110, 111, 112, 90, 102) are welded to the tubular frame (30) and substantially enclosing it and hiding it from view. The outer skins also define the door frames (90, 92, 94, 102, 104, 106) welded to the vertical door frame members (36) and upper and lower horizontal frame members (34, 36, 38, 40), forming a generally vertical door-frame mating plane. The doors (16, 18) are hung in the door openings and operable to substantially close the door opening and meet the door-frame mating plane. Flat strips of environmental and EMI shielding gaskets (100, 132, 138) are used between the door (16, 18) and the door frame skins (90, 92, 94, 102, 104, 106) where they meet in the door-frame mating plane.

25 Claims, 6 Drawing Sheets

TRANSPORTABLE WEATHERTIGHT EMI SHIELDED CABINET STRUCTURE

RELATED APPLICATIONS

This application is related to U.S. patent application No. 08/342,839, entitled *Transportable Weathertight EMI Shielded Cabinet Enclosure*, filed Nov. 21, 1994 of the same assignee, attorney docket number 36560-1128.

TECHNICAL FIELD OF THE INVENTION

This invention relates in general to the field of electronic equipment housing. More particularly, the present invention relates to a transportable weathertight, electromagnetic interference (EMI) shielded cabinet structure for housing electronic equipment.

BACKGROUND OF THE INVENTION

Bell Communications Research (Bellcore) and BellSouth Telecommunications have established more stringent requirements for electronic equipment cabinets. These cabinets are intended to house various types of telecommunications equipment, including active electronic and optical systems and passive mechanical cross-connect and splicing fields. The cabinets are required to protect the electronics equipment from a wide range of ambient temperatures and inclement climatic conditions including rain, snow, sleet, high winds, wind driven rain, ice, and sand storms. These cabinets must pass stringent weathertightness rain intrusion, wind driven rain intrusion, salt fog spray, temperature cycling, and high humidity tests.

In addition to weathertightness, the cabinet must also provide electromagnetic field interference (EMI) shielding to meet the Federal Communications Commission (FCC) electromagnetic emission and immunity criteria. If not properly shielded, the electronic equipment may emit signals that interfere with the operation of unrelated equipment. Proper shielding also prevents radio frequency signals from sources outside of the cabinet from adversely interfering with the operations of the digital telecommunications system in the cabinet.

The new specification set forth by the telecommunications industry may also require the cabinets to be transportable with the equipment installed therein. Previously constructed cabinets do not provide adequate support for the contents while it is being transported. Bellcore's *General Requirements for Electronic Equipment Cabinets*, Technical Advisory TA-NWT-000487, Issue 2, June 1993, and BellSouth Telecommunications' *Electronic Equipment Cabinets (Subscriber Carrier/Fiber in the Loop)*, Specification BS-631-0032, Issue 1, Nov. 1992, may be consulted for a detailed description of the requirements and the test criteria.

Accordingly, a need has arisen for a cabinet to house electronic equipment that meets the weathertightness, electromagnetic interference shielding, and transportability requirements as set forth above. To satisfy these requirements, the cabinet structure, door, and door mating surfaces are specially designed to provide structural integrity and shielding from the weather and electromagnetic interference.

SUMMARY OF THE INVENTION

In accordance with the present invention, a weather and EMI shielded cabinet structure and enclosure are Bell Communications Research (Bellcore) and BellSouth Telecommunications have established more stringent requirements for electronic equipment cabinets. These cabinets are intended to house various types of telecommunications equipment, including active electronic and optical systems and passive mechanical cross-connect and splicing fields. The cabinets are required to protect the electronics equipment from a wide range of ambient temperatures and inclement climatic conditions including rain, snow, sleet, high winds, wind driven rain, ice, and sand storms. These cabinets must pass stringent weathertightness rain intrusion, wind driven rain intrusion, salt fog spray, temperature cycling, and high humidity tests.

In addition to weathertightness, the cabinet must also provide electromagnetic field interference (EMI) shielding to meet the Federal Communications Commission (FCC) electromagnetic emission and immunity criteria. If not properly shielded, the electronic equipment may emit signals that interfere with the operation of unrelated equipment. Proper shielding also prevents radio frequency signals from sources outside of the cabinet from adversely interfering with the operations of the digital telecommunications system in the cabinet.

The new specification set forth by the telecommunications industry may also require the cabinets to be transportable with the equipment installed therein. Previously constructed cabinets do not provide adequate support for the contents while it is being transported. Bellcore's *General Requirements for Electronic Equipment Cabinets*, Technical Advisory TA-NWT-000487, Issue 2, June 1993, and BellSouth Telecommunications' *Electronic Equipment Cabinets (Subscriber Carrier/Fiber in the Loop)*, Specification BS-631-0032, Issue 1, November 1992, may be consulted for a detailed description of the requirements and the test criteria.

Accordingly, a need has arisen for a cabinet to house electronic equipment that meets the weathertightness, electromagnetic interference shielding, and transportability requirements as set forth above. To satisfy these requirements, the cabinet structure, door, and door mating surfaces are specially designed to provide structural integrity and shielding from the weather and electromagnetic interference. provided which eliminate the disadvantages associated with prior electronic equipment cabinets.

In one aspect of the invention, a weathertight and EMI shielded cabinet for housing electronic equipment is disclosed. The cabinet is structurally supported and framed by a tubular frame which defines a generally rectangular structure having upper and lower rectangular frames joined by vertical corner posts. The tubular frame may include internal cross members to further reinforce the structure. Door openings are further defined by vertical door frame members. A plurality of outer skins are welded to the tubular frame and substantially enclose it and hide it from view. The outer skins include horizontal and vertical door frame skins welded to the vertical door frame members and upper and lower rectangular frames, forming a generally vertical door mating plane. The doors are hung in the door openings and operable to substantially close the door opening and meet the door mating plane. Flat strips of environmental and EMI shielding gaskets are used between the door and the door frame skins where they meet in the door mating plane.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1–11 of the drawings, like numerals being used for like and corresponding parts of the various drawings.

Figure 1:
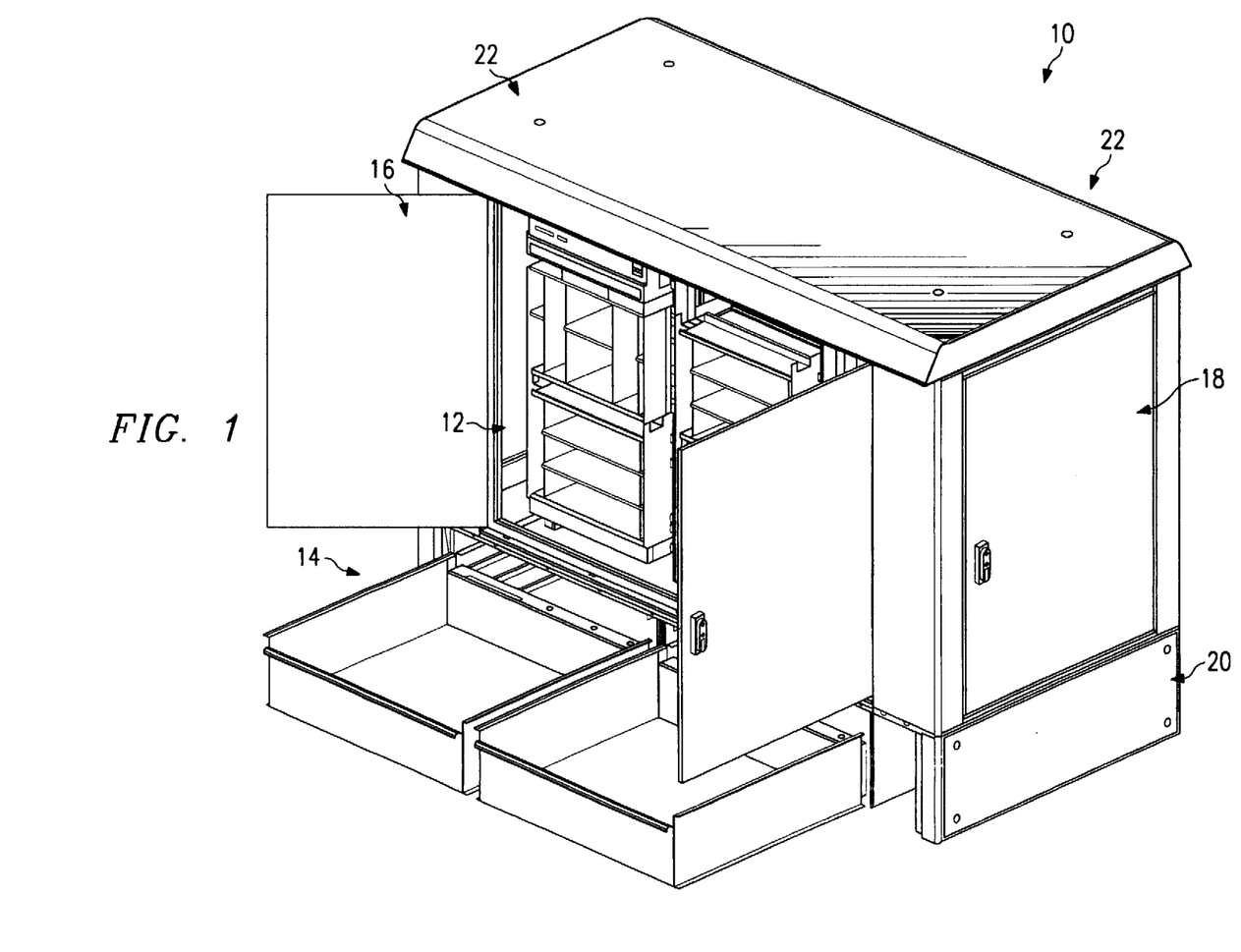
FIG. 1 is an isometric view of a preferred embodiment of the cabinet constructed in accordance with the teachings of the present invention.

Referring to FIG. 1, a cabinet 10 constructed in accordance with the teachings of the present invention is shown. The cabinet 10 is designed with an internal frame structure with outer skins attached thereto, the details of which are described below. As shown, equipment racks 12 may be installed in the cabinet 10 to support electronic equipment (not shown), and drawers 14 are provided below to house equipment such as backup power batteries (not shown). Four side access doors are provided, including two double doors 16 (only one shown) and two single end doors 18 (only one shown), to allow easy craft access to the equipment. Removable panels 20 are provided below end doors 18 to shield the bottom storage portion. Furthermore, threaded openings 22 are located on top of the cabinet 10 to enable attachment of lift equipment to transport the cabinet 10.

Figure 2:
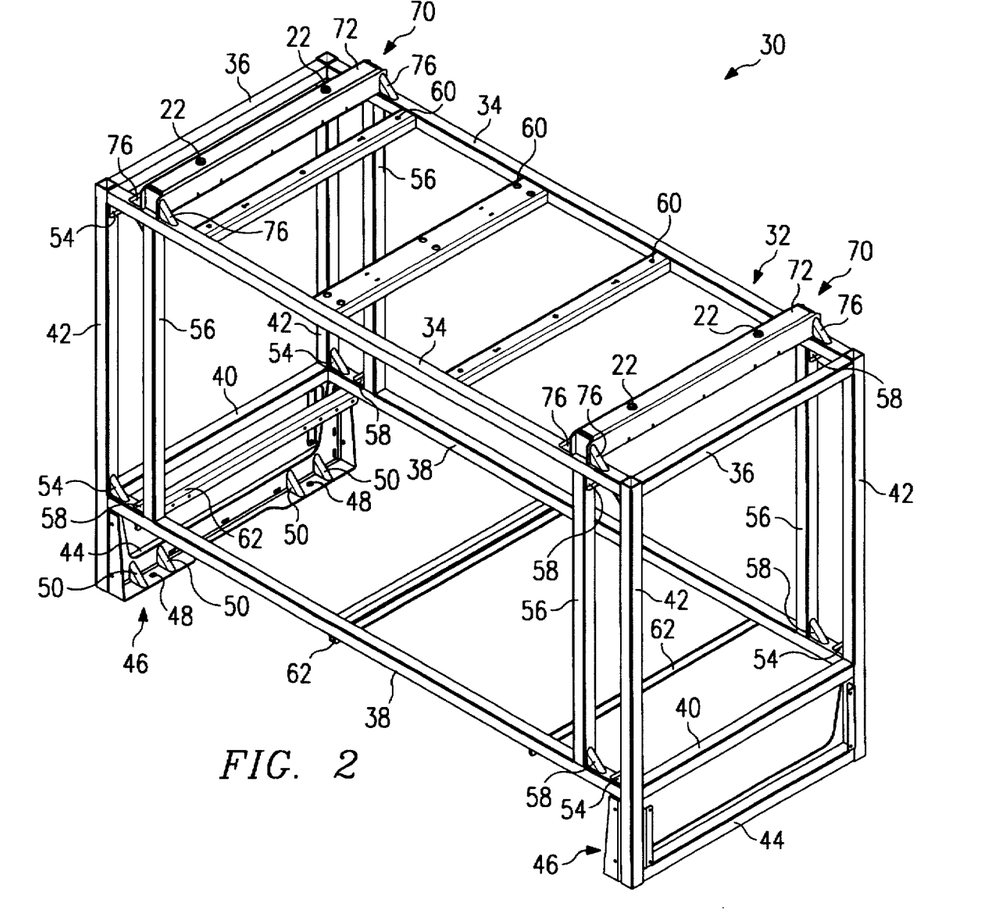
FIG. 2 is an isometric view of a preferred embodiment of the tubular frame structure of the cabinet.
Figure 3:
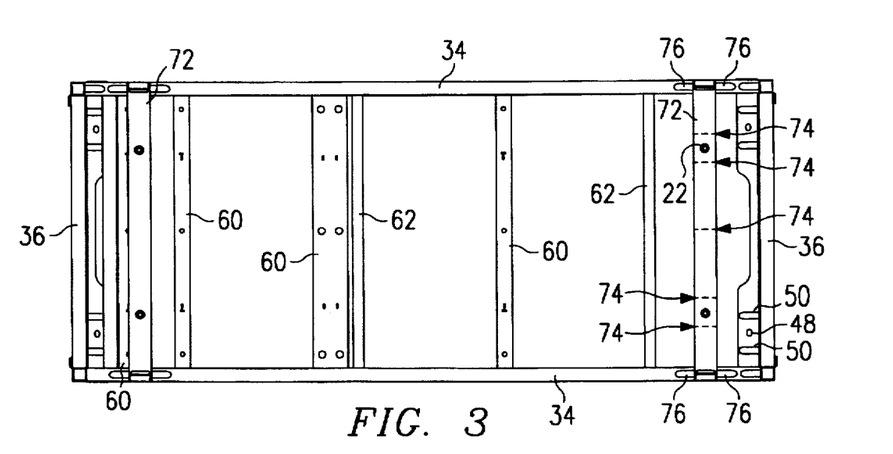
FIG. 3 is a top view of the tubular frame structure.

Referring to FIGS. 2 and 3, a tubular frame structure 30 of a cabinet constructed in accordance with the present invention is shown. FIG. 3 offers a top view of the tubular frame structure 30 to show additional details. The tubular frame 30 is constructed from a high strength tubing preferably of 6061-T6 aluminum with ⅛" wall thickness or a comparable material with similar properties. The tubing preferably has a square cross-section, but other structural shapes may be applicable if they yield substantially the same structural integrity. This may include stock with a circular cross-section, three-sided square cross-section, T-shaped cross-section, L-shaped cross-section, and comparable configurations. Other materials may also be used, for example: 4130, 4140, 4135, and 4340 alloy steel seamless mechanical tubing; 4140 and 4142 alloy steel annealed or heat treated seamless mechanical tubing; 4340 alloy steel annealed seamless mechanical tubing, type 304, 316, 321, and 347 stainless steel tubing; 3003 aluminum drawn seamless mechanical tubing; 5052 aluminum drawn seamless mechanical tubing; and 6063 aluminum extruded seamless mechanical tubing.

The tubular frame structure 30 has an outer frame structure 32 formed by two upper horizontal members 34, two upper horizontal end members 36, lower horizontal members 38, lower horizontal end members 40, vertical members 42, and mounting support members 44. The outer frame structure 32 forms a generally rectangular structure, where the members are welded or otherwise joined at right angles with adjoining members. The vertical members 42 generally form the corner posts in the rectangular structure. The outer frame structure 32 generally provides the structural integrity and rigidity for the cabinet, which are important to weathertightness and electromagnetic interference shielding. The outer frame structure 32 also bears substantially all the weight of the electronic equipment housed in the cabinet 10.

Welded or otherwise bonded to the mounting support members 44 are mounting flanges 46, which provide the surfaces for mounting the cabinet on a stable substrate, such as a concrete pad. As shown, defined on mounting flanges 46 are openings or holes 48 for receiving bolts or like fasteners therethrough. A plurality of reinforcing gussets 50 provide additional welding surfaces for added strength and structural integrity to the mounting flanges 46 and mounting support members 44. A number of reinforcing gussets 54 may also be used to provide structural integrity to the outer frame structure 32 at the corners between the vertical members 42 and the upper and lower horizontal members 34 and 38.

Figure 4:
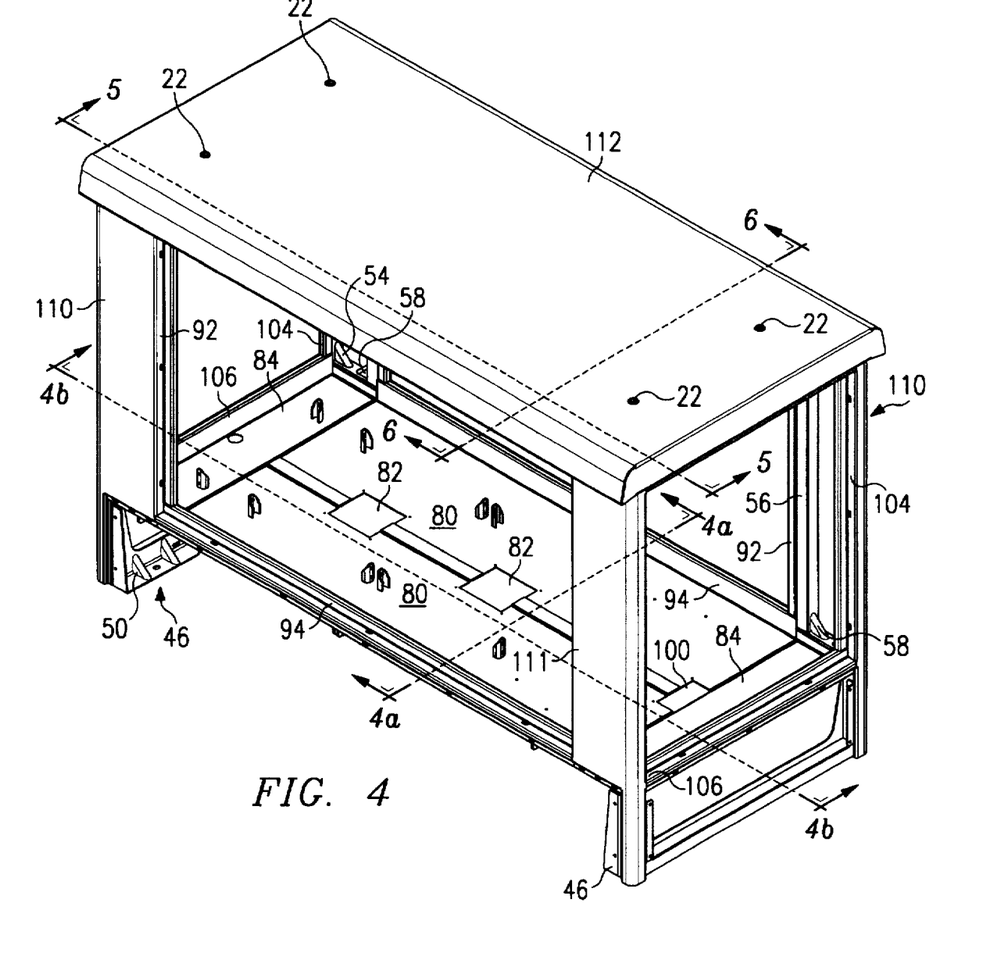
FIG. 4 is an isometric view of a preferred embodiment of the skin construction and attachment of the cabinet.

The tubular frame structure 30 further includes a number of cross members to reinforce the structure and/or provide support for the cabinet doors and the contents thereof. Among them are vertical door frame members 56 which provide the vertical framing and support for the cabinet doors. The vertical door frame members 56 are also reinforced by gussets 58. A number of upper cross members 60 and lower cross members 62 are welded between the upper and lower horizontal members 34 and 38, respectively, to provide mounting and support for the racks 12 (FIG. 1) containing the electronic equipment and for the drawers 14. The racks 12 are mounted between the upper cross members 60 and the floor skins 80 (FIG. 4). It may be noted that the racks 12 and the position and number thereof are dependent on the configuration of the electronic equipment to be housed in the cabinet 10 and may be arranged accordingly.

To provide liftability and transportability, lift assemblies 70 for the cabinet are provided. The lift assemblies 70 include tubular lift members 72 formed out of a high strength material such as 6061-T6 aluminum sheet stock. Further provided to reinforce the tubular lift members 72 are internal cross-sectional reinforcing supports 74 (FIG. 3) and exterior gussets 76. Four threaded holes 22 are provided on the tubular lift members 72 for receiving eye bolts or like implements to be coupled to a lifting device or equipment. It may be seen that tubular lift members 72 are generally positioned directly above the vertical door frame members 56. Therefore, the lifting forces exerted on the lift assemblies 70 are transferred to the upper horizontal members 34, the vertical door frame members 56, and vertical members 42, which then transfer the load to the lower horizontal members 38 and lower horizontal end members 40.

Figure 5:
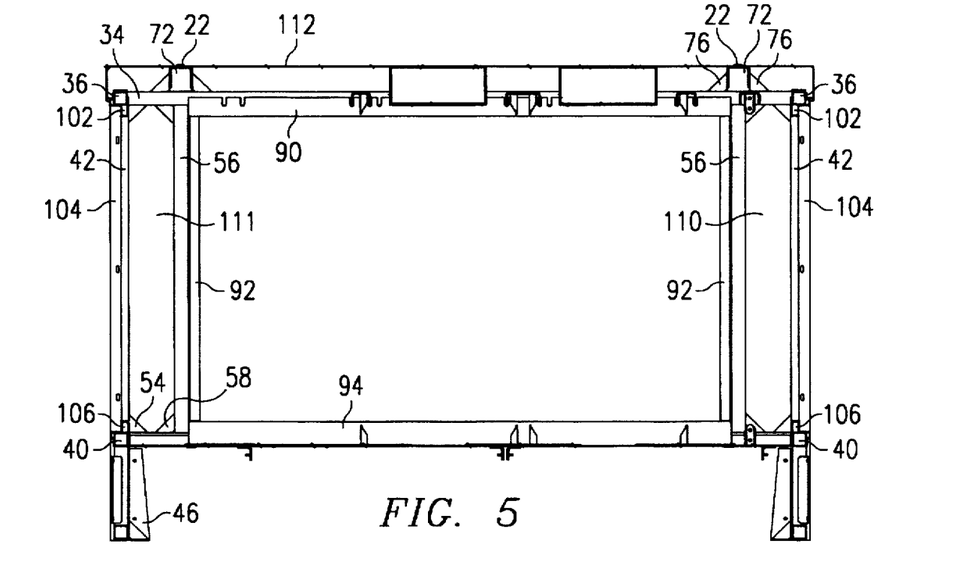
FIG. 5 is a cross-sectional view along line 5—5 in FIG. 4 of the cabinet with the skins attached.

Referring to both FIGS. 4 and 5, an outer skin layer is welded or otherwise securely attached to the tubular frame structure 30 of the cabinet 10. As a result, the tubular frame structure 30 is substantially enclosed by skins and hidden from view either within the cabinet or outside the cabinet. Therefore the skins perform the function of shielding the electronic equipment from environmental factors and preventing electromagnetic radiation from escaping the cabinet. In addition, the skins perform a cosmetic function to hide the tubular frame structure 30. The skins are preferably constructed and formed from sheets of high strength aluminum and welded to the tubular frame structure 30 and to one another. In general, continuous welding is used for those joints that require weathertightness, and spot welding may be used for interior joints.

Figure 4A:
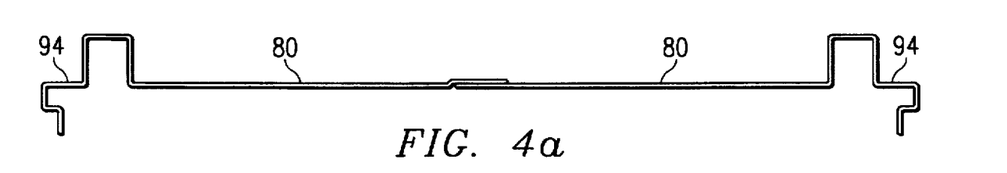
FIGS. 4a and 4b are cross-sectional views of the floor skin arrangement.
Figure 4B:
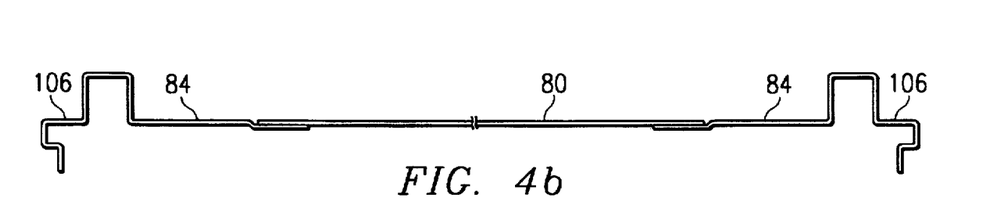

The floor skins 80 are welded or otherwise attached to lower horizontal frame members 38 and 40 to form the floor of the cabinet 10. Two openings 82 are defined in the floor skins 80 to provide air to air exchange between the interior of the cabinet 10 and the exterior ambient. Another opening 100 is provided for service cable passage. Two end floor skins 84 are provided at the two ends of the cabinet and welded to the lower horizontal frame members 38 and 40 between the vertical members 42 and door frame member 56. As shown in FIGS. 4a and 4b, the contacting edges of the skins 80 and 84 may be formed to provide a strip of raised or lowered flat surface for overlapping with one another, so that both sets of skins 80 and 84 lie on the same plane and provide a substantially level floor surface.

Figure 6:
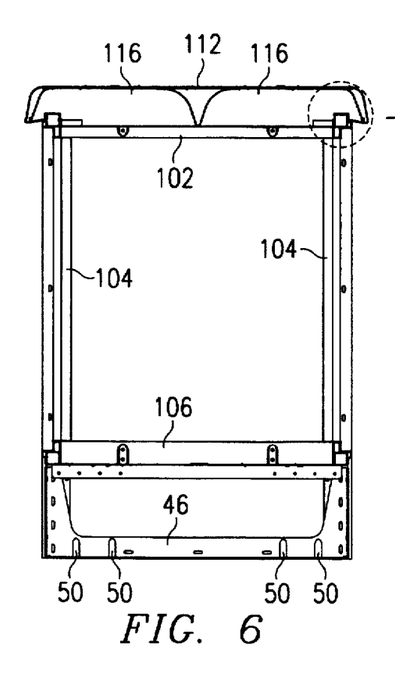
FIG. 6 is a cross-sectional view along line 6—6 in FIG. 4 of the cabinet with the skins attached.
Figure 7:
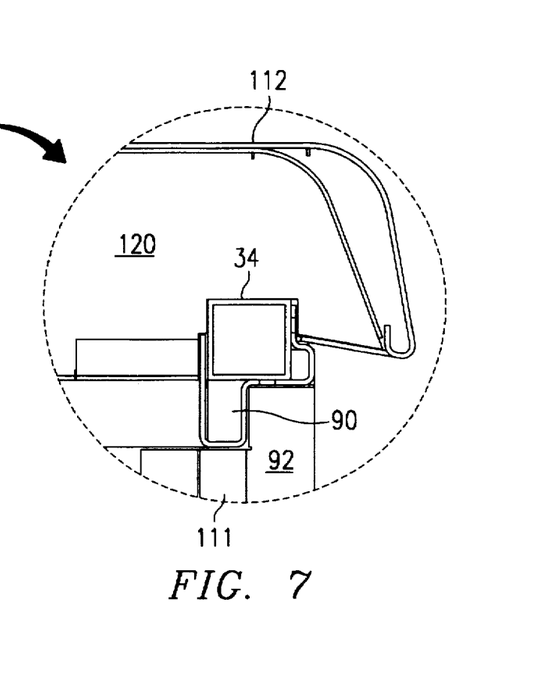
FIG. 7 is an enlarged detailed view of a preferred embodiment of the door mating surface and geometry construction.
Figures 8, 10A, 10B, 10C, 11:
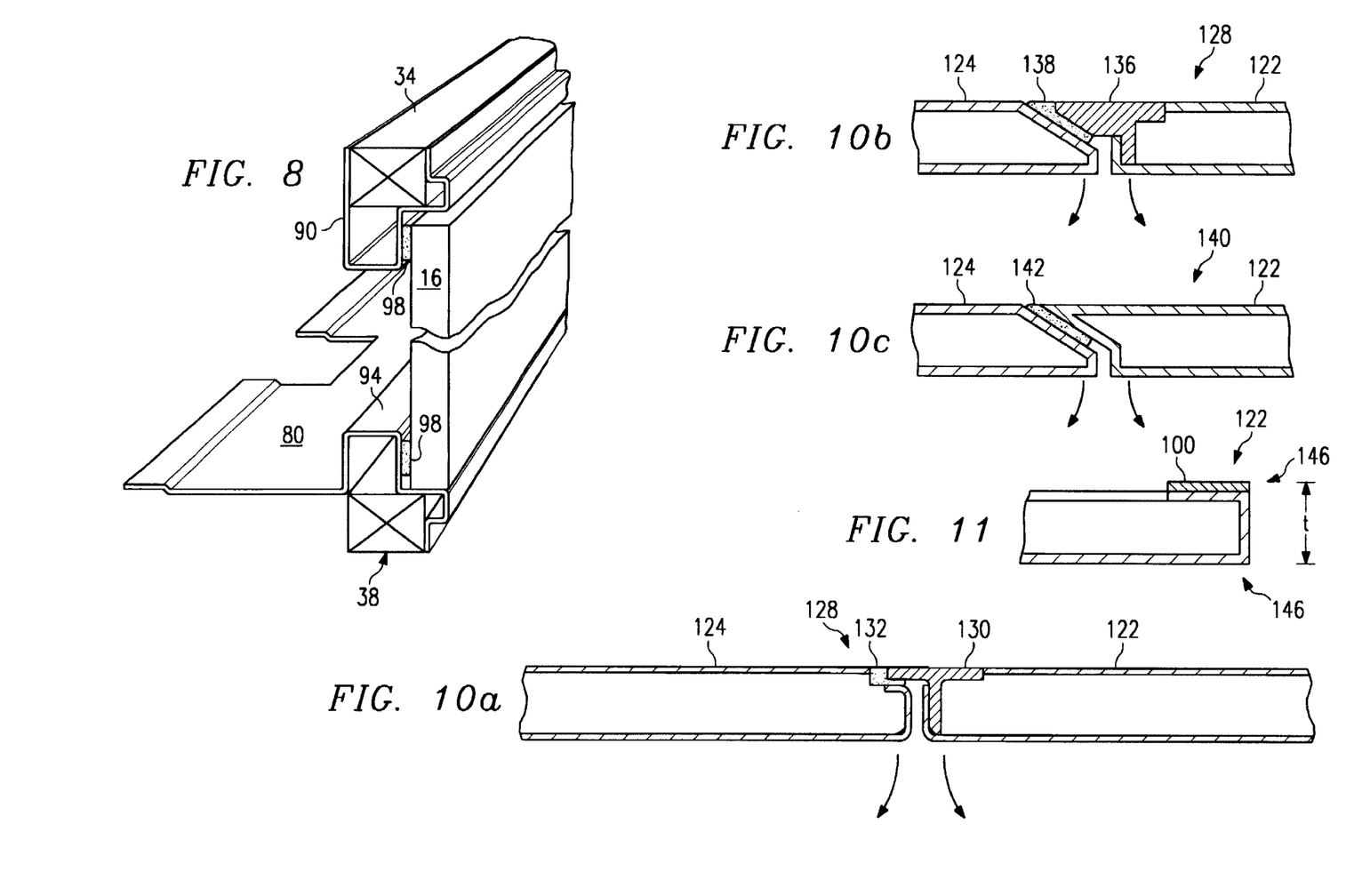
FIG. 8 is an isometric enlarged detailed view of the door mating surface and geometry and door.
FIG. 10a is a cross-sectional view along line 10—10 in FIG. 9 showing a preferred embodiment of the door mating geometry and surface of the double doors.
FIG. 10b is a cross-sectional view along line 10—10 in FIG. 9 showing an embodiment of the door mating geometry and surface of the double doors.
FIG. 10C is a cross-sectional view along line 10—10 in FIG. 9 showing yet another embodiment of the door mating geometry and surface of the double doors.
FIG. 11 is a cross-sectional view along line 11—11 in FIG. 9 showing the outer edge construction of the doors.

All the access doors 16 and 18 (FIG. 1) meet the cabinet at respective vertical planes defined by skins welded to the tubular frame structure 30. FIGS. 6, 7, and 8 provide detailed views of the structures of the skins forming the frames for the access doors 16 and 18. The openings for the double access doors 16 are framed by an upper skin 90, door framing portions 92 of the corner skins 110 and 111, and door framing portions 94 of the floor skin 80. The corner skin 111 is the mirror image of the corner skin 110. The skins 90, 110, 111, and 80 are formed to define two generally vertical door meeting planes substantially parallel with the sides of the cabinet defined by the corner skins 110 and 111 for the two double doors 16. It may be seen that although it is preferable to form the door framing portions 92 and 94 from the corner skins 110 and 111 and the floor skins 80, respectively, the door framing portions 92 and 94 may be formed from separate sheet stock and welded to the outer skins 110, 111, and 80 and the tubular frame structure 30.

The openings for the end access doors 18 are similarly constructed from upper skins 102, end door framing portions 104 of the corner skins 110 and 111, and door framing portions 106 of the end floor skins 84. FIG. 8 shows the use of an electromagnetic interference and environmental sealing gasket 98 at the door-to-door frame interface. These gaskets 98 may incorporate self-adhesive strips thereon for easy attachment to the door mating surfaces. Since the perimeters of each of the doors 16 and 18 meet the door frames at a flat surface or vertical plane parallel with the sides of the cabinet 10, such flat strips of electromagnetic interference and weather shielding gaskets 98 may be used, such as the Elastomet® composite gaskets or Duolastic™ wire screen impregnated elastomer gaskets manufactured by Tecknit of Cranford, N.J. Other forms and types of gaskets also may be adapted for sealing the door mating plane.

The four corner skins 110 and 111 are formed and welded to vertical tubular frame members 42 and 56, horizontal members 38, 40, 36, 34, and the skins 90, 80, 102, and 84 framing the door openings. It may be seen that once the doors 16 and 18 are closed, they are flush with the same planes defined by the corner skins 110 and 111.

A roof skin 112 is further formed and welded into place. To ensure weathertightness, a continuous weld secures the roof skin 112 to the rest of the skins 90, 102, 110, and 111. As shown, two plenums 116 may be provided in the roof area for operating with a cooling system, such as heat exchanges (not shown), to moderate the cabinet temperature. The plenums 116 separate internal air from external air but allows the heat accumulated in the cabinet to be transferred to the outside air by routing the internal air through a series of channels in contact with the outside air. Such cooling methods are generally known in the art.

Accordingly, the tubular frame structure 30 provides the structural rigidity and integrity of the cabinet 10, and the skins provide the electromagnetic and environmental shielding of the cabinet contents. It may be seen that the skins do not and need not provide structural support to the contents of the cabinet 10. Therefore, when the cabinet 10 is lifted via the threaded openings 22 and the lift assemblies 70, the weight of the cabinet 10 and the electronics equipment remain resting on the structurally sound tubular frame structure 30 instead of the skins. For increased capacity, the tubular frame structure 30 may be strengthened to accommodate the added load.

Figure 9:
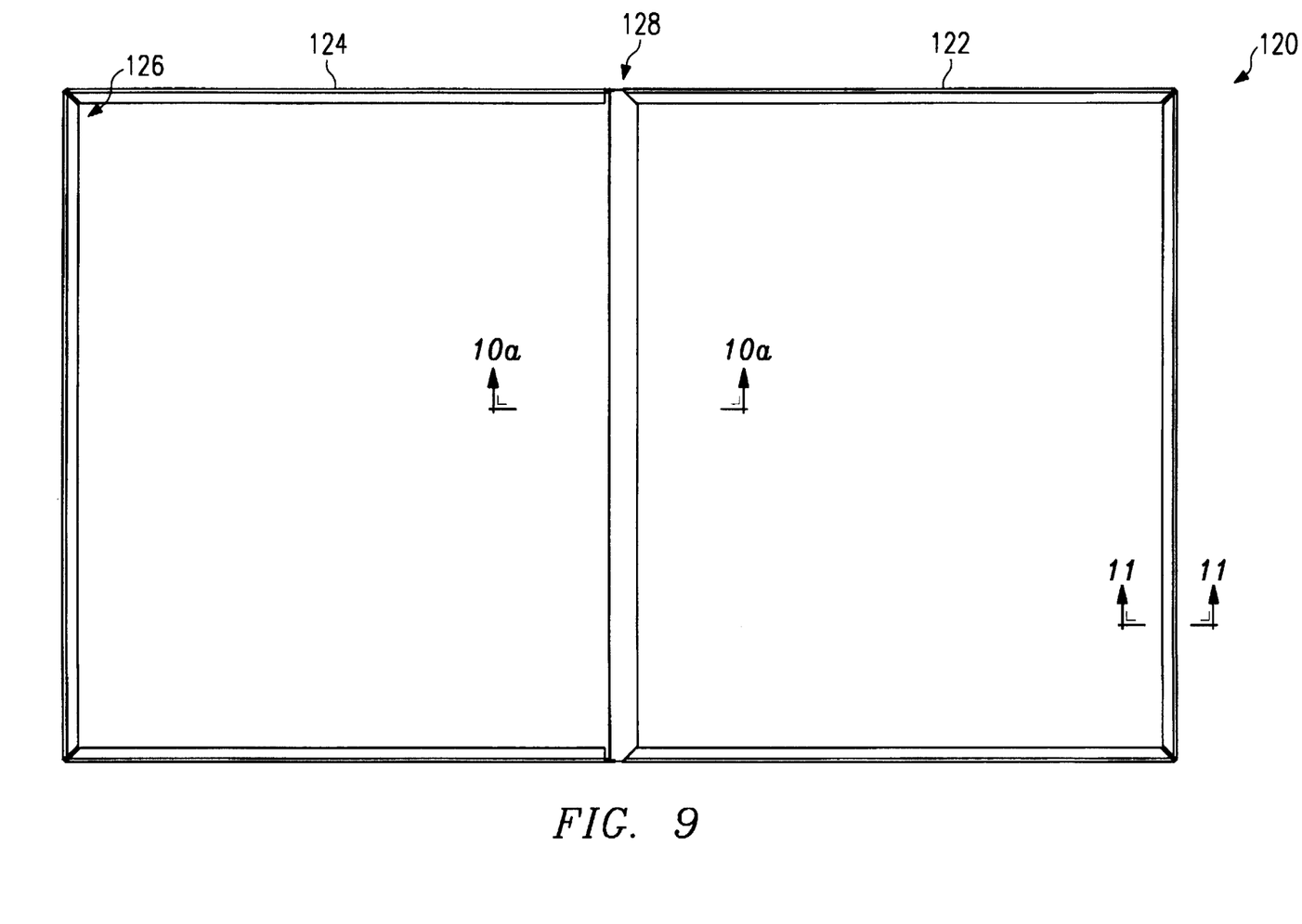
FIG. 9 is a front view of the cabinet double door as viewed from the interior.

Referring to FIG. 9, outward swinging double doors 120 having two door sections 122 and 124 are used for enclosing the double door openings. The double doors 120 are shown with a frontal view of its interior surface 126 in FIG. 9. FIGS. 10a, 10b, and 10c show exemplary embodiments of the mating configuration 128 of the door sections 122 and 124. The arrows indicate the direction of door swing.

In FIG. 10a, a substantially rigid beam 130 having a generally T-shaped cross-section is welded onto one of the door sections 122. The T cross-section beam 130 extends substantially the entire height of the doors 120 to stiffen the mating surfaces of the two door sections 122 and 124. The T cross-section beam 130 has a planar surface that is substantially level with the interior plane defined by the double doors 120. The T cross-section beam 130 further has an L-shaped sealing surface, which enables a sealing gasket 132 to be adhered to either door sections 122 or 124 or the T-section 130 to seal off weather elements and electromagnetic interference. The L-shaped sealing surface, with its mating area spanning two axes, can be effectively sealed. Constructed in this manner, a possible route for rain water and electromagnetic radiation is cutoff by the rigid and unflexing construction of the T cross-section beam 130 and the seal 132.

As shown in FIG. 10b, other cross-sectional geometries may also be used. In FIG. 10b, a beam 136 having a wedge cross-section is welded onto the door section 122. The other door section 124 is formed to closely mate with the diagonal surface of the beam 136. The result is an elongated and substantially straight line mating surface that may be easily sealed with an environment and electromagnetic interference gasket 138 attached to either door sections 122 or 124.

FIG. 10c shows another configuration 140 for the door sections 122 and 124. The door sections 122 and 124 may be constructed to have the elongated and diagonal mating surfaces as shown, with a gasket 142 at the interface.

Referring to FIG. 11, a cross-sectional portion of the door section 122 is shown. All doors, including the lateral double doors 16 and end doors 18 (FIG. 1), are formed from high strength sheet aluminum with a square bend 146 on all edges. The square bend 146 and, minimally, the gasket 100 define the thickness of the doors, t, which is equal to the depth defined by the door frame members 90, 92, 94, 102, 104, and 106. Constructed in this manner, each door 16 and 18 meet the cabinet 10 at a single vertical plane with its interior surface butting up against the plane defined by the door frame skin members 90, 110, 111, 80, 102, 104, and 84 with its exterior surface lying on the same plane as the corner skins 110 and 111. Possible entry or exit points for rain water and electromagnetic radiation are thus minimized and easily sealed off by installing appropriate gaskets. All the cabinet doors may be hung with conventional hinges (not shown) in a conventional manner, preferably located internally in the cabinet 10 and hidden from view from the exterior of the cabinet.

It may be seen that the cabinet construction has an added advantage of being symmetrical along a center plane down the length of the cabinet 10. Constructed in this manner, the majority of the parts on one side of the center plane are duplicates or mirror images of the parts on the other side, thereby simplifying and streamlining the manufacturing and assembly process.

In operation, electronics equipment such as those used in the telecommunications industry are installed on racks and secured in the cabinet 10. Backup power batteries may be stowed in the drawers 14 underneath the main cabinet interior. The cabinet may be moved and transported without adversely affecting the structural integrity of the cabinet 10 due to rigidity provided by its unique tubular frame structure 30. Weather and electromagnetic interference shielding is made possible by devising unique door mating geometries and surfaces. These doors mating surfaces are easily sealable with conventional gaskets.

Although the present invention and its advantages have been described in detail, it should be understood that various changes, substitutions and alterations can be made therein without departing from the spirit and scope of the invention as defined by the appended claims.

What is claimed is:

1. A weathertight and EMI shielded cabinet for housing electronic equipment, comprising:
   a generally rectangular frame having four upper horizontal frame members, four lower horizontal frame members, and four vertical frame members bonded to one another, at least two of said vertical frame members defining at least one door opening;
   a plurality of outer skins welded to said rectangular frame and substantially enclosing it therein, said plurality of outer skins defining an upper side, four vertical sides, and a lower side of said cabinet, said outer skins further defining a door frame around said at least one door opening, said plurality of outer skins comprise:
   at least one floor skin welded to said lower frame members and forming a floor;
   four corner skins welded to said frame members, said corner skins substantially enclosing said vertical frame members; and
   a roof welded to said four corner skins; and
   at least one door hung in said at least one door opening, said at least one door having an exterior surface forming a substantially vertical plane with said respective vertical side of the cabinet.

2. The cabinet, as set forth in claim 1, wherein said floor skin forms a lower portion of said door frame, said corner skins form vertical portions of said door frame, and said plurality of outer skins further includes at least one skin forming an upper portion of said door frame.

3. The cabinet, as set forth in claim 1, wherein said rectangular frame further includes first and second lifting assemblies coupled to said upper horizontal frame members.

4. The cabinet, as set forth in claim 3, wherein said first and second lift assemblies each includes:
   a tubular lift member having a generally square cross-section;
   threaded openings defined in an upper surface of said tubular lift member;
   a plurality of reinforcing support members bonded internally in the cross-section of said tubular lift member; and
   lift member gussets reinforcing the coupling between said tubular lift member and said upper horizontal frame members.

5. The cabinet, as set forth in claim 1, wherein said rectangular frame further includes first and second mounting support members coupled to said lower horizontal frame members.

6. The cabinet, as set forth in claim 1, wherein said first and second mounting support members each further includes:
   a substantially triangular mounting flange coupled to said mounting support member, said mounting flange defining a plurality of mounting openings thereon for receiving fasteners therethrough; and
   a plurality of mounting flange gussets reinforcing said mounting flange.

7. The cabinet, as set forth in claim 1, wherein said rectangular frame further includes a plurality of gussets strategically positioned to reinforce the rectangular frame.

8. The cabinet, as set forth in claim 1, wherein said at least one floor skin defines at least one opening therein enabling heat exchange between the cabinet and outside air.

9. The cabinet, as set forth in claim 1, wherein said at least one floor skin comprises:
   two identical elongated portions in parallel relationship with overlapping edges;
   two identical end portions in perpendicular relationship with said elongated portions and having overlapping edges therewith; and
   said elongated and end floor portions forming a level floor of said cabinet.

10. The cabinet, as set forth in claim 1, wherein said at least one floor skin defines at least one opening therein for service cable passage.

11. The cabinet, as set forth in claim 1, further comprising at least two vertical door frame posts coupled between said upper and lower horizontal frame members defining a width dimension of said at least one door opening.

12. The cabinet, as set forth in claim 1, further comprising four doors with respective door frames framing respective door openings, each door forming a substantially vertical plane with a respective vertical side of the cabinet.

13. The cabinet, as set forth in claim 1, further comprising two double doors and two end doors with respective door frames framing respective door openings, each door forming a substantially vertical plane with a respective vertical side of the cabinet.

14. The cabinet, as set forth in claim 1, further comprising EMI and environmental sealing gaskets positioned between said door and said door frame.

15. The cabinet, as set forth in claim 1, further comprising flat strips of an EMI and environmental sealing gasket positioned between said door and said door frame.

16. A weathertight and EMI shielded cabinet for housing electronic equipment, comprising:

- a tubular frame defining a generally rectangular structure, said tubular frame including:
    - four upper horizontal frame members, four lower horizontal frame members, and four vertical frame members bonded to one another, said vertical frame members defining two end door openings;
    - at least one upper cross member coupled between two of said upper horizontal frame members, and at least one lower cross member coupled between two of said lower horizontal frame members; and
    - two sets of vertical door frame posts coupled between said upper and lower horizontal frame members defining two lateral door openings;
- a plurality of outer skins bonded to said tubular frame structure and substantially enclosing it therein, said skins including:
    - at least one floor skin bonded to said lower horizontal frame members and forming a floor;
    - four corner skins bonded between said upper and lower horizontal frame members and to said vertical frame members, said corner skins substantially enclosing said vertical frame members; and
    - a roof bonded to said corner skins;
- a door hung in each of said door openings and its exterior surface forming a substantially vertical plane with said respective vertical side of the cabinet when closing off said door opening.

17. The cabinet, as set forth in claim 16, wherein said tubular frame further includes first and second lifting assemblies coupled to said upper horizontal frame members.

18. The cabinet, as set forth in claim 17, wherein said first and second lift assemblies each includes:

- a tubular lift member having a generally square cross-section;
- threaded openings defined in an upper surface of said tubular lift member;
- a plurality of reinforcing support members bonded internally in the cross-section of said tubular lift member; and
- lift member gussets reinforcing the coupling between said tubular lift member and said upper horizontal frame members.

19. The cabinet, as set forth in claim 16, wherein said tubular frame further includes first and second mounting support members coupled to said lower horizontal frame members.

20. The cabinet, as set forth in claim 19, wherein said first and second mounting support members each further includes:

- a substantially triangular mounting flange coupled to said mounting support member, said mounting flange defining a plurality of mounting openings thereon for receiving fasteners therethrough; and
- a plurality of mounting flange gussets reinforcing said mounting flange.

21. The cabinet, as set forth in claim 16, wherein said tubular frame further includes a plurality of gussets strategically positioned to reinforce the tubular frame structure.

22. The cabinet, as set forth in claim 16, wherein said at least one floor skin defines openings therein enabling heat exchange between the cabinet and outside air and service cable passage.

23. The cabinet, as set forth in claim 16, wherein said floor skin comprises:

- two identical elongated portions in parallel relationship having overlapping elongated edges;
- two identical end portions in perpendicular relationship with said elongated portions and partially overlapping edges said identical elongated portions; and
- said elongated and end portions forming a level floor of said cabinet.

24. The cabinet, as set forth in claim 16, wherein said doors comprise two end doors adapted to close off said end door openings defined by said vertical frame members.

25. The cabinet, as set forth in claim 16, wherein said doors comprises two double doors adapted to close off said lateral door openings defined by said vertical door frame posts.

* * * * *

UNITED STATES PATENT AND TRADEMARK OFFICE
CERTIFICATE OF CORRECTION

PATENT NO. : 5,545,845
DATED : Aug. 13, 1996
INVENTOR(S) : Flores

It is certified that error appears in the above-identified patent and that said Letters Patent is hereby corrected as shown below:

Column 8, line 22, please delete "1", and insert -- 5 --.

Signed and Sealed this

Eighteenth Day of March, 1997

Attest:

BRUCE LEHMAN

Attesting Officer

Commissioner of Patents and Trademarks